United States Patent [19]

Chebi et al.

[11] Patent Number: 5,279,865
[45] Date of Patent: Jan. 18, 1994

[54] HIGH THROUGHPUT INTERLEVEL DIELECTRIC GAP FILLING PROCESS

[75] Inventors: Robert P. Chebi, Austin, Tex.; Sanjiv Mittal, Fremont, Calif.

[73] Assignee: Digital Equipment Corporation, Maynard, Mass.

[21] Appl. No.: 722,861

[22] Filed: Jun. 28, 1991

[51] Int. Cl.$^5$ .................. B05D 3/06; B05D 3/14; C23C 16/00
[52] U.S. Cl. .................. 427/574; 427/573; 427/571; 427/575; 427/579
[58] Field of Search .............. 427/574, 573, 571, 575, 427/579, 570; 118/723

[56] References Cited

PUBLICATIONS

Matsuo et al, "Low Temperature Chemical Vapor Deposition Method Utilizing an Electron Cyclotron Resonance Plasma", Jpn. J. Appl. Phys. 22(4) Apr. 1983 pp. L210–L212.
Herak et al, "Low-temperature deposition of silicon dioxide films from electron cyclotron resonant microwave plasmas", J. Appl. Phys. 65(6) Mar. 1989 pp. 2457–2463.
Popov et al, "Electron cyclotron resonance plasma stream source for plasma enhanced chemical vapor deposition", J. Vac. Sci. Technol. A 7(3), May/Jun. 1989 pp. 914–917.
Fukuda et al, "Effect of excited plasma species on silicon oxide films formed by microwave plasma CVD", Jpn. J. Appl. Phys. 28(6) Jun. 1989 pp. 1035–1040.

*Primary Examiner*—Roy King
*Attorney, Agent, or Firm*—Flehr, Hohbach, Test, Albritton & Herbert

[57] ABSTRACT

Interlevel gaps between closely spaced circuit elements, such as closely spaced metal interconnect lines, are filed using a biased electron cyclotron resonance (ECR) deposition process. The gaps between circuit elements may be separated by distances of less than 0.6 microns and the gaps can have aspect rations in excess of 2.0. To fill such gaps between the circuit elements on a semiconductor wafer, the wafer is mounted in an ECR reaction chamber. A continuing flow of oxygen ($O_2$) and silane ($SiH_4$) gas is introduced into the ECR system's plasma and reaction chambers, respectively, while applying a microwave excitation so as to generate a plasma. High deposition rates and low film stress are achieved by controlling the flow of oxygen and silane so as to maintain an oxygen to silane gas flow ratio of less than 1.5. In addition, the wafer is cooled, typically using helium, so as to maintain wafer temperature below 300 degrees Celsius, because maintaining low temperatures during ECR deposition has been found to both increase the oxide deposition rate and to reduce the deposited film's compressive stress. This method makes it possible to achieve oxide deposition rates of 6000 Angstroms and above, with film stress below $1.5 \times 10^9$ dynes/cm$^2$. Furthermore, these deposition rates and film stresses are obtained with a high degree of uniformity from wafer to wafer.

14 Claims, 3 Drawing Sheets

HIGH THROUGHPUT INTERLEVEL DIELECTRIC GAP FILLING PROCESS

The present invention relates generally to oxide deposition during the processing of semiconductor wafers, and particularly to a process for filling very narrow interlevel gaps, such as the gaps between parallel metal lines, with silicon oxide.

BACKGROUND OF THE INVENTION

Dielectric planarization has become extremely important for multilevel interconnection of very large scale integrated (VLSI) circuits as device geometries have become smaller and circuit densities have become higher. See, for example, A. C. Adams and C. D. Capio, Journal of Electrochemical Society, Vol. 128, 1981, pp. 423. With smaller geometries, the planarization of dielectric layers in multilevel interconnects requires two stages: interlevel dielectric gap filling, and subsequent local or global planarization. The present invention is concerned only with gap filling, and in particular with a high throughput gap filling process.

Referring to FIG. 1, there are shown two closely spaced metal lines on a silicon substrate. The metal lines are separated by a lateral distance of $\Delta X$, and have a height of $\Delta Y$. The space between the metal lines is called a "gap", having an aspect ratio defined as $\Delta Y/\Delta X$. After depositing and defining the metal interconnection lines of a semiconductor circuit, it is usually necessary to fill the gaps between interconnection lines, and to cover the entire interconnect layer with silicon oxide before proceeding with the next manufacturing step. Filling such gaps, without creating voids in which no oxide is deposited, becomes increasingly difficult as the gap width becomes smaller than one micron and as the aspect ratio increases above a value of 1.0 Voids are undesirable because they can contribute to electrical shorts and long term device reliability problems.

Current techniques in plasma enhanced chemical vapor deposition (PECVD) employ a sequence of deposition, etch and deposition steps for good quality interlevel dielectric (ILD) gap filling, without void formation, for interconnect spaces smaller than 1.0 microns and aspect ratios greater than unity. The prior art deposition/etch/deposition sequence typically requires three to four process chambers to accomplish good quality oxide ILD gap fill, and therefore has low throughput. As device geometries shrink below 0.6 micron, it has been found that the prior art deposition/etch/deposition sequence is unable to satisfactorily fill ILD gaps at sufficient wafer throughput.

Biased electron cyclotron resonance (ECR) plasma deposition technology has been demonstrated to gap fill and planarize small spaces at high aspect ratios (e.g., aspect ratios of 2.0 and higher). Biased ECR deposition yields high quality oxide films. The principles of ECR plasma technology are described by J. Asmussen, J. Vacuum Science Technology A, Vol. 7, No. 3, May/June 1989, p. 883, which is hereby incorporated by reference as background information. Published articles which describe prior art biased ECR deposition technology including (1) S. Matsuo and M. Kiuchi, Japan Journal of Applied Physics, Vol. 22, No. 4, April 1983, p. L210, and (2) D. R. Dennison, C. Chiang, and D. Fraser, Ext. Abstracts, 175th ECS Meeting, Los Angeles, Vol. 89-1, Spring 1989, p. 261.

The major shortcomings of biased ECR deposition have been (1) low deposition rates (under about 1500 Angstroms/min), and (2) high compressive film stress (typically greater than $3 \times 10^9$ dynes/cm$^2$. Low deposition rates make biased ECR deposition unacceptably expensive for large scale semiconductor manufacturing, and high film stress can lead to device failures. The present invention overcomes both of these problems.

SUMMARY OF THE INVENTION

In summary, the present invention is a semiconductor processing method for filling interlevel gaps between closely spaced circuit elements, such as closely spaced metal interconnect lines. The gaps between such circuit elements may be separated by distances of less than 0.6 microns and the gaps can have aspect rations in excess of 2.0. To fill such gaps between the circuit elements on a semiconductor wafer, the wafer is mounted in an electron cyclotron resonance (ECR) reaction chamber. A continuing flow of oxygen ($O_2$) and silane ($SiH_4$) gas is introduced into the ECR system's plasma and reaction chambers, respectively, while applying a microwave excitation so as to generate a plasma.

High deposition rates and low film stress are achieved by controlling the flow of oxygen and silane so as to maintain an oxygen to silane gas flow ratio between 1.0 and 1.5. In addition, the wafer is cooled, typically using backside helium or water cooling apparatus, so as to maintain wafer temperature below 300 degrees Celsius, because maintaining low temperatures during ECR deposition has been found to both increase the oxide deposition rate and to reduce the deposited film's compressive stress. Using the present invention, it is possible to achieve oxide deposition rates of 6000 Angstroms and above, with film stress below $1.5 \times 10^9$ dynes/cm$^2$. Furthermore, using the methodology of the present invention, these deposition rates and film stresses are obtained with a high degree of uniformity from wafer to wafer. It is the inventors opinion that this low temperature, low stress process will enhance the reliability of the underlying aluminum interconnect layer.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
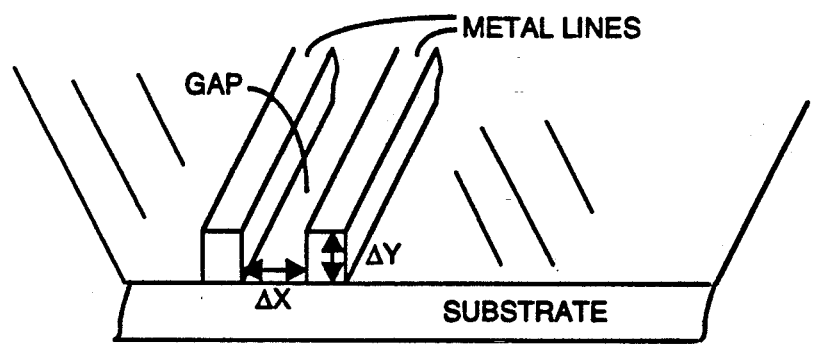
FIG. 1 depicts an interlevel dielectric (ILD) gap between two semiconductor circuit structures.
Figure 2:
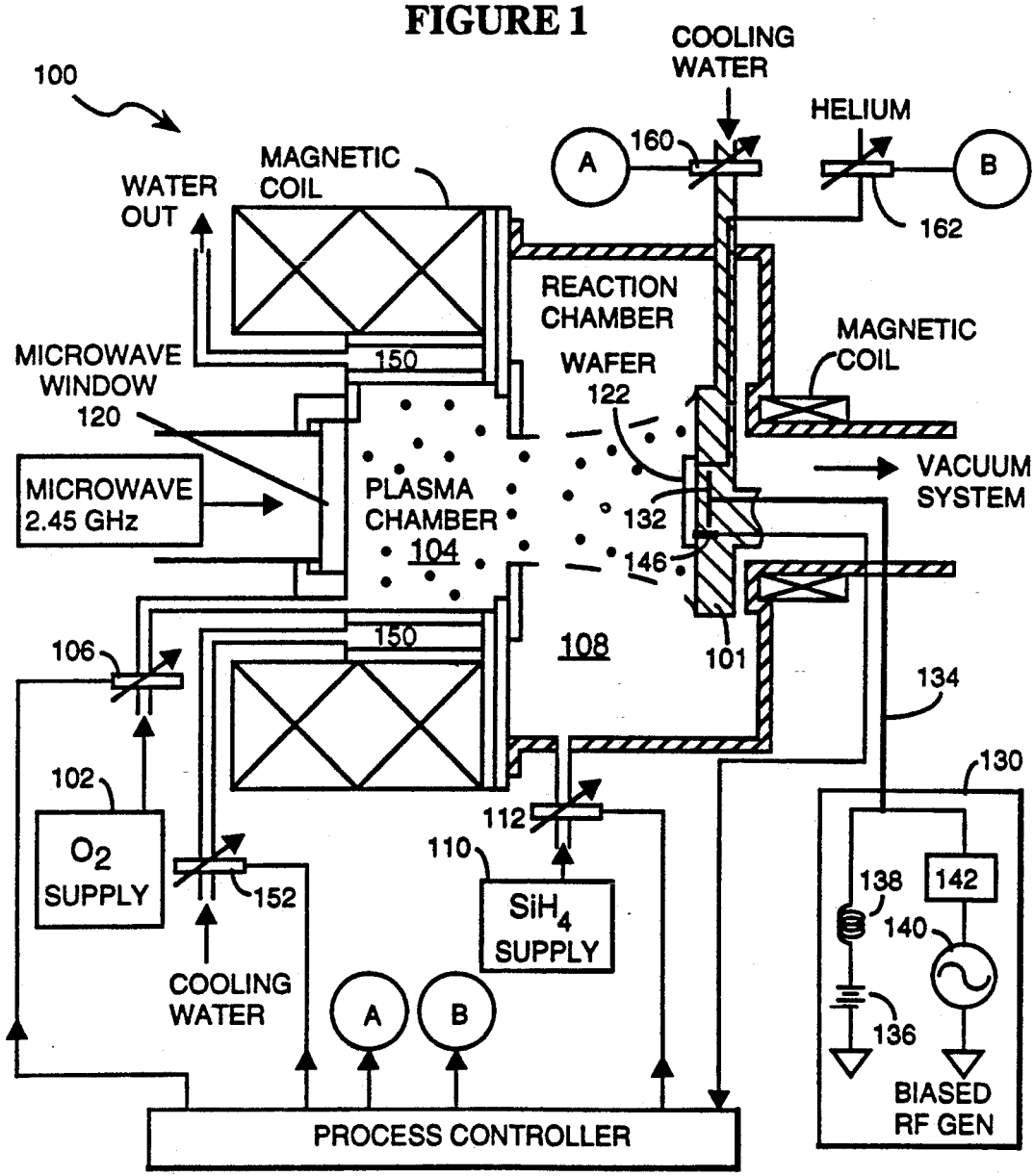
FIG. 2 is a block diagram of a biased electron cyclotron resonance (ECR) plasma deposition system.

Referring to FIG. 2, there is shown a biased electron cyclotron resonance (ECR) plasma deposition system 100 (such as the Sumitomo EC3000) with an Nippon Telephone & Telegram type ECR source with a 150 mm electrostatic chuck 101. Operation of ECR deposition systems is well known to those skilled in the art, and therefore only those aspects of the system 100 directly relevant to the present invention are described herein. All measurements and parameters described herein pertain to processing a 150 mm diameter wafer having an approximate surface area of 170 cm$^2$.

Oxygen ($O_2$) from an oxygen supply 102 flows into the system's plasma chamber 104 at a rate determined by flow control valve 106. Similarly, silane ($SiH_4$) from a silane supply 110 flows into the system's reaction chamber 108 at a rate determined by flow control valve 112. In alternate embodiments, the silane gas in the silane supply 110 may be mixed with argon.

Microwave power of at least 2500 Watts is applied to the plasma chamber's microwave window 120, thereby creating an ECR plasma with oxygen. A biased RF electrical signal is applied to the electrostatic chuck 101 through a conductive plate 132 supporting the semiconductor wafer 122 being processed. The resulting biased RF electrical field causes ions in the plasma chamber to bombard the wafer 122 and to react with the silane, thereby depositing silicon oxide on the wafer. The biased RF field is generated by an RF 13.56 Megahertz signal generator 140, which is connected to the plate 132 by an impedance matching circuit 142 and conductor 134.

The wafer 122 is held to the chuck 101 by a d.c. electrostatic field generated by d.c. power source 136, which is coupled to the plate 132 by an inductor 138 and conductor 134. A voltage of about one thousand volts is typically used to hold the wafer 122 to the chuck 101 by electrostatic force.

The plasma chamber 104 is cooled by water flowing through a water jacket 150, as controlled by on/off flow control valve 152 so as to prevent the system from heating to excessive temperatures during ECR operation. Similarly, the chuck 101 is cooled during ECR operation by water flowing through the chuck 101, as controlled by on/off flow control valve 160.

In addition to cooling of the chuck 101 with water, the system 100 cools the wafer 122 by helium flowing through small holes or grooves in the wafer contacting surface of the chuck 101. A temperature probe 146 in the chuck 101, positioned so as to contact the back of the wafer 122, generates signals indicative of the wafer's temperature during processing. Temperature of the wafer 122 or other substrate being processed is controlled by regulating the flow of helium with a flow control valve 162.

A process controller 170, typically a programmed microcontroller, controls flow valves 106 and 112 so as to maintain a specified total gas flowrate into the ECR chambers, and to maintain a specified flow ratio of oxygen to silane (in units of standard cubic centimeters per minute). During oxide deposition, the process controller 170 opens flow valves 152 and 160 so as to maintain the plasma chamber 104 and chuck 101 at normal operating temperatures. In addition, the process controller 170 regulates the flowrate of helium through flow valve 162 so as to keep the wafer 122 at or near a specified target temperature.

Figure 3:
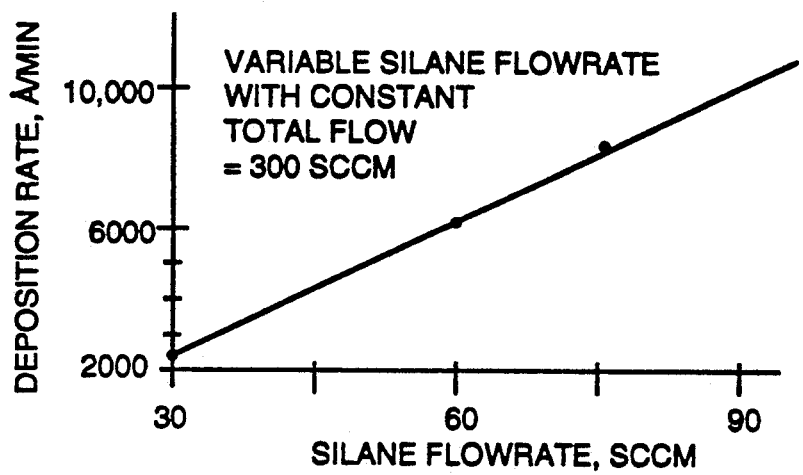
FIG. 3 is a graph depicting the relationship between silane flow rate and the oxide deposition rate in a biased ECR plasma deposition system.

Referring to FIG. 3, the inventors have found that the oxide film deposition rate varies linearly with the silane flow rate. All other process parameters, including total gas flow, were kept constant. FIG. 3 shows that the oxide deposition rate can vary from 2500 Angstroms per minute to 13,000 Angstroms per minute as the silane flowrate varies from 30 standard cubic centimeters per minute (sccm) to 100 sccm at a fixed total gas flow of 300 sccm, with wafer temperature at 250 degrees Celsius, and RF bias power set at 1000 watts (i.e., about 5.9 watts per square centimeter).

The inventors have found that a silane flow rate of at least 50 sccm for a 150 mm wafer (with an approximate surface area of 170 cm$^2$) was required to maintain an oxide deposition rate of at least 4000 Angstroms per minute. The preferred range of silane flow for a 170 cm$^2$ wafer is 50 to 90 sccm. This indicates that silane flow should be at least 0.29 sccm per square centimeter of wafer or substrate surface area being processed, with a preferred range of 0.30 to 0.55 sccm per square centimeter of wafer surface area being processed.

Figure 4:
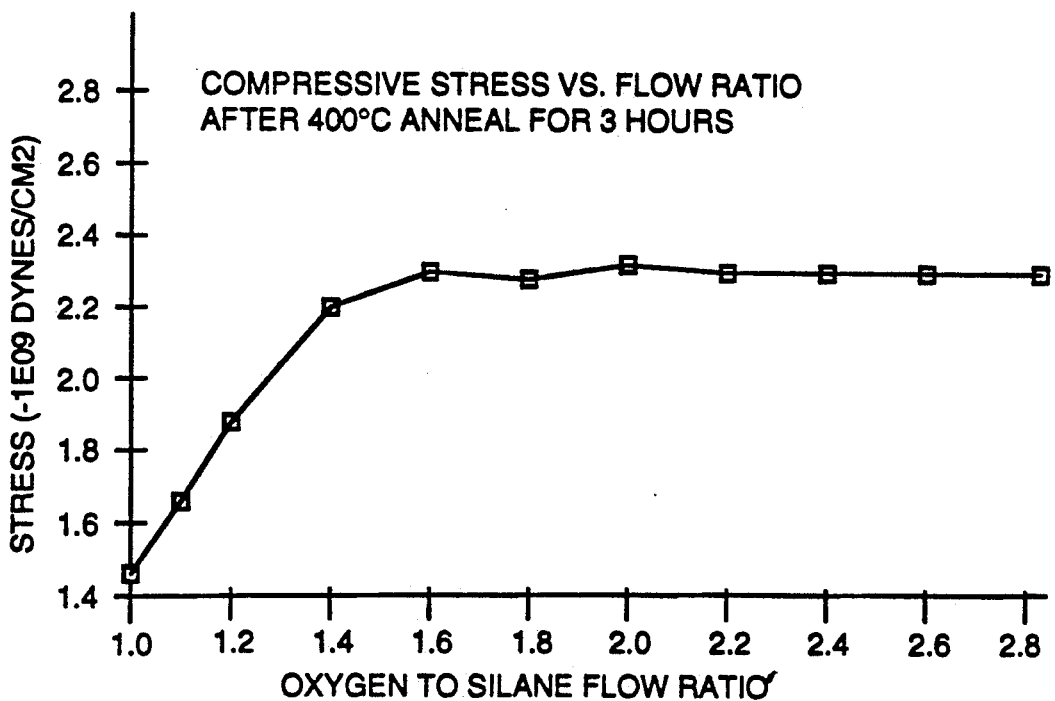
FIG. 4 is a graph depicting the relationship between the flow ratio of oxygen to silane and the film stress of oxide deposited by a biased ECR plasma deposition system.

FIG. 4 shows the effect of the oxygen/silane flow ratio in the gas on oxide film stress. Experiments by the inventors have shown that as the oxygen to silane ratio goes below 1.5, film stress decreases, and the stability of the oxide film increases. The data in FIG. 4 shows compressive film stress after the wafer was annealed for three hours. In addition, the inventors have found that the refractive index of the oxide film does not change significantly after annealing for the low oxygen to silane ratio process, with refractive index values of $1.4630 \pm 0.0005$.

Fourier transformed infrared spectrum analyses of the oxide films obtained when using an oxygen to silane ratio of 0.8 indicate incomplete oxidation, caused by insufficient oxygen in the gas, whereas films deposited using an oxygen to silane ratio of 1.1 did not have that problem. Therefore it is preferred to use oxygen to silane ratios above 0.8. More specifically oxygen to silane ratios between 1.0 and 1.5 are most preferred, as this range has been found to be most consistent with both fast deposition rates and low stress films.

Figure 5:
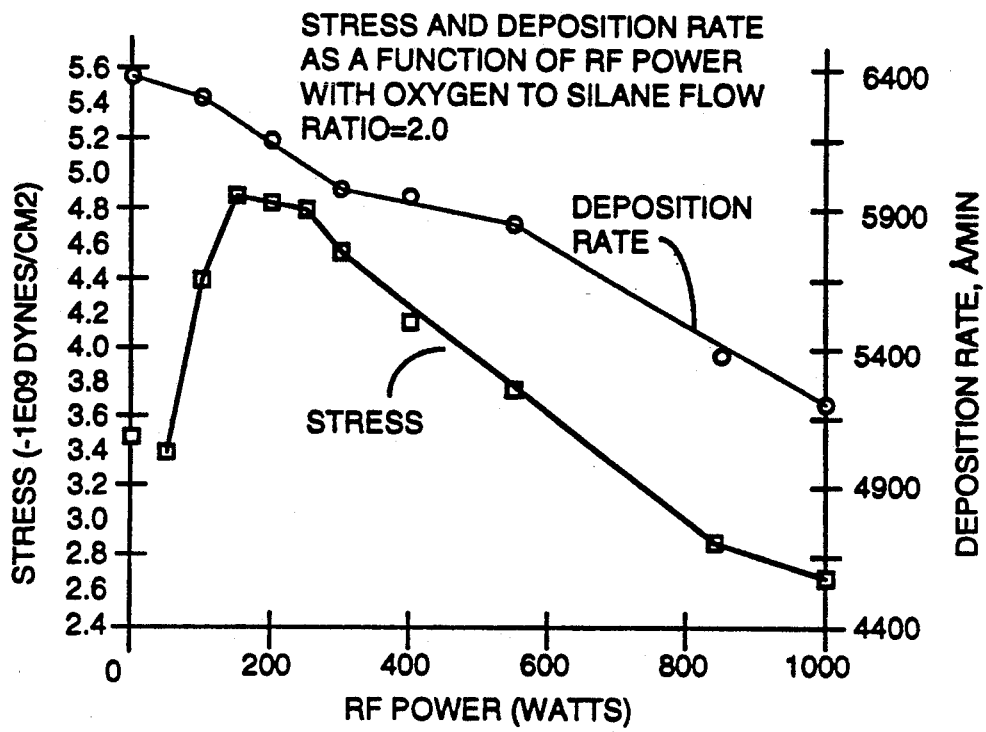
FIG. 5 is a graph depicting the relationship between applied RF power in a biased ECR plasma deposition system with (A) the oxide deposition rate, and (B) the film stress of oxide deposited by the system.

FIG. 5 shows the effect of applied RF bias on oxide film stress and deposition rate. Higher RF bias results in a decrease in compressive stress and lower deposition rates. This is an unexpected result, because high RF bias is associated with higher compressive stress in dual-frequency non-biased ECR PECVD films. In biased ECR deposition, the reduction in compressive film stress with increased RF bias appears to be due to a bond relaxation mechanism. A major issue with using higher RF bias power to reduce film stress lies in its potential to cause device degradation or gate oxide damage. In experiments by the inventors, application of 600 watts RF bias power (i.e., about 3.5 watts per square centimeter) left voids in ILD gaps, whereas application of 1000 watts RF bias power (i.e., about 5.9 watts per square centimeter) produced void-free ILD gap fill.

Figure 6:
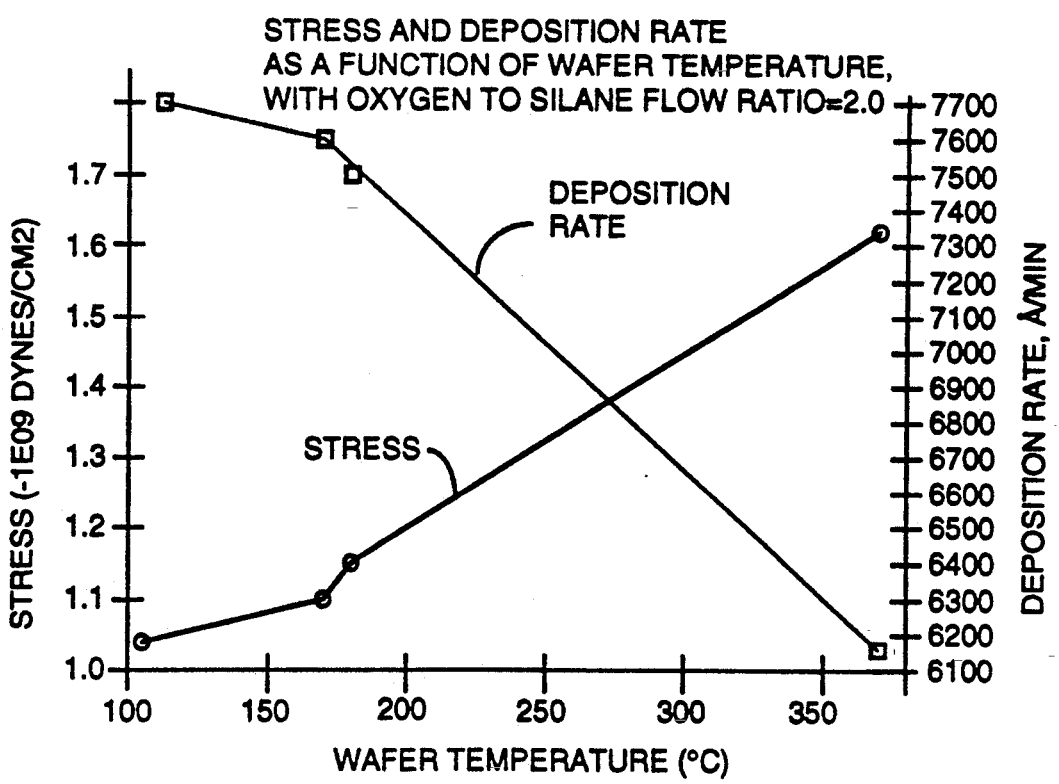
FIG. 6 is a graph depicting the relationship between applied wafer temperature in a biased ECR plasma deposition system with (A) the oxide deposition rate, and (B) the film stress of oxide deposited by the system.

FIG. 6 shows the effect of wafer temperature on oxide film stress and deposition rate. Lower temperatures result in both lower stress and a higher deposition rate. Experimental data shows that wafer temperatures should be kept below 300 degrees Celsius in most applications, with a preferred wafer temperature range of 125 to 225 degrees Celsius. Wafer temperature is controlled by setting the flow rate of Helium using flow valve 162 (see FIG. 2) in accordance with the selected wafer target temperature.

Studies performed by the inventors have shown that the above described silicon oxide deposition process is characterized by high throughput, unusually low compressive film stress, and agressive gap filling.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of depositing a silicon oxide film on a semiconductor substrate, comprising:
   mounting the semiconductor substrate in an electron cyclotron resonance chamber;
   depositing said silicon oxide film on said semiconductor substrate at a rate greater than 4000 Angstroms per minute by:
   supplying a continuing flow of oxygen and silane gas into the chamber while applying microwave excitation so as to generate an ECR plasma in the chamber; wherein said supplying step supplies a flow of silane gas of at least $N \times 0.29$ standard cubic centimeters per minute (sccm), where N is the surface area of said semiconductor substrate in units of square centimeters, and supplies a flow of oxygen with a flow rate selected so as to maintain an oxygen to silane gas flow ratio of less than 1.5.

2. The method of claim 1, wherein said oxygen to silane gas flow ratio is maintained in the range of about 1.0 to less than 1.5.

3. The method of claim 2, further including cooling said semiconductor substrate so as to maintain said semiconductor substrate at a temperature below 300 degrees Celsius.

4. The method of claim 1, further including cooling said semiconductor substrate so as to maintain said semiconductor substrate at a temperature below 300 degrees Celsius.

5. The method of claim 1, further including cooling said semiconductor substrate so as to keep said semiconductor substrate's temperature between 125 and 225 degrees Celsius.

6. The method of claim 5, said supplying step providing a flow of silane gas between $N \times 0.30$ and $N \times 0.50$ sccm.

7. The method of claim 1, said supplying step providing a flow of silane gas between $N \times 0.30$ and $N \times 0.50$ sccm.

8. The method of claim 1, further including applying a RF bias field in said electron cyclotron resonance chamber, said RF bias field being applied with a power level greater than 3.5 watts per square centimeter surface area of said semiconductor substrate so as to produce said deposited silicon oxide film with compressive stress of less than $1.5 \times 10^9$ dynes/cm$^2$.

9. The method of claim 1, further including applying a RF bias field in said electron cyclotron resonance chamber, said RF bias field being applied with a power level sufficient to produce said deposited silicon oxide film with compressive stress of less than $1.5 \times 10^9$ dynes/cm$^2$.

10. A method of depositing a silicon oxide film on a semiconductor substrate, comprising:
    mounting the semiconductor substrate in an electron cyclotron resonance chamber; and
    depositing said silicon oxide film on said semiconductor substrate at a rate greater than 4000 Angstroms per minute by (A) supplying a continuing flow of silane gas of at least $N \times 0.29$ standard cubic centimeters per minute (sccm), where N is the surface area of said semiconductor substrate in units of square centimeters; (B) supplying a flow of oxygen with a flow rate selected so as to maintain an oxygen to silane gas flow ratio of less than 1.5; (C) applying microwave excitation so as to generate an ECR plasma in the chamber; and (D) applying a RF bias field in said electron cyclotron resonance chamber, said RF bias field being applied with a power level sufficient to produce said deposited silicon oxide film with compressive stress of less than $1.5 \times 10^9$ dynes/cm$^2$.

11. The method of claim 10, further including cooling said semiconductor substrate so as to maintain said semiconductor substrate at a temperature below 300 degrees Celsius and supplying sufficient silane gas flow to deposit said silicon oxide film on said semiconductor substrate at a rate of at least 6000 Angstroms per minute.

12. A method of performing chemical vapor deposition of silicon oxide to fill interlevel gaps on a semiconductor substrate, comprising:
    mounting the semiconductor substrate in an electron cyclotron resonance chamber wherein said semiconductor substrate has an exposed, nonplanar surface containing interlevel gaps;
    depositing low compressive stress silicon oxide, having compressive stress of less than $1.5 \times 10^9$ dynes/cm$^2$, on said semiconductor substrate at a rate in excess of 4000 Angstroms per minute so as to substantially completely fill said interlevel gaps with said deposited low compressive stress silicon oxide;
    said depositing step including:
    supplying a continuing flow of oxygen and silane gas into the chamber while applying microwave excitation so as to generate an ECR plasma in the chamber; said supplying step including (A) supplying a flow of silane gas of at least $N \times 0.29$ standard cubic centimeters per minute (sccm), where N is the surface area of said semiconductor substrate in units of square centimeters, and (B) supplying a flow of oxygen with a flow rate selected so as to maintain an oxygen to silane gas flow ratio of less than 1.5.

13. The method of claim 12, further including applying a RF bias field in said electron cyclotron resonance chamber, said RF bias field being applied with a power level sufficient to produce deposited silicon oxide having compressive stress of less than $1.5 \times 10^9$ dynes/cm$^2$.

14. The method of claim 12, further including applying a RF bias field in said electron cyclotron resonance chamber, said RF bias field being applied with a power level greater than 3.5 watts per square centimeter surface area of said semiconductor substrate so as to produce deposited silicon oxide having compressive stress of less than $1.5 \times 10^9$ dynes/cm$^2$.

* * * * *